US011009544B2

(12) United States Patent
Uchida et al.

(10) Patent No.: US 11,009,544 B2
(45) Date of Patent: May 18, 2021

(54) INSPECTION SYSTEM, WAFER MAP DISPLAY, WAFER MAP DISPLAY METHOD, AND COMPUTER PROGRAM

(71) Applicant: TOKYO ELECTRON LIMITED, Tokyo (JP)

(72) Inventors: Shin Uchida, Yamanashi (JP); Tetsuya Kagami, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 56 days.

(21) Appl. No.: 16/499,159

(22) PCT Filed: Feb. 8, 2018

(86) PCT No.: PCT/JP2018/004408
§ 371 (c)(1),
(2) Date: Sep. 27, 2019

(87) PCT Pub. No.: WO2018/179890
PCT Pub. Date: Oct. 4, 2018

(65) Prior Publication Data
US 2020/0064398 A1 Feb. 27, 2020

(30) Foreign Application Priority Data
Mar. 30, 2017 (JP) .............................. JP2017-067047

(51) Int. Cl.
*G01R 31/28* (2006.01)
(52) U.S. Cl.
CPC ..... *G01R 31/2889* (2013.01); *G01R 31/2893* (2013.01)

(58) Field of Classification Search
CPC ................ G01R 1/0491; G01R 31/265; G01R 31/3012; G01R 31/318511
See application file for complete search history.

(56) References Cited

U.S. PATENT DOCUMENTS

2010/0237894 A1* 9/2010 Sano ................... G01R 31/2891
324/762.05
2013/0200914 A1* 8/2013 Kim ................... G01R 1/07342
324/756.03

(Continued)

FOREIGN PATENT DOCUMENTS

JP 2011-210775 A 10/2011

OTHER PUBLICATIONS

PCT International Search Report and Written Opinion, PCT Application No. PCT/JP2018/004408, dated Apr. 3, 2018, 8 pages (with English translation of PCT International Search Report).

*Primary Examiner* — Tung X Nguyen
(74) *Attorney, Agent, or Firm* — Fenwick & West LLP

(57) ABSTRACT

An inspection system is provided with a prober and a tester. The tester includes a plurality of tester module boards on which a plurality of LSIs respectively corresponding to a plurality of devices under test (DUT) are mounted; a display unit which displays a wafer map indicating inspection results of the plurality of DUTs and/or self-diagnosis results of the tester; and a tester control unit which includes a wafer map drawing application for drawing the wafer map displayed on the display unit. The wafer map drawing application causes the inspection results and/or the self-diagnosis results to be displayed for each of the plurality of DUTs in a stepwise manner. In the wafer map, the plurality of DUTs are respectively linked to correspond to the plurality of LSIs mounted on the plurality of tester module boards.

17 Claims, 6 Drawing Sheets

(56) References Cited

U.S. PATENT DOCUMENTS

2016/0334461 A1* 11/2016 Wu .................... G01R 31/2834
2018/0356444 A1* 12/2018 Ganapol ............ G01R 31/2886

* cited by examiner

DISPLAY ONLY
SlotNo FOCUS

INSPECTION SYSTEM, WAFER MAP DISPLAY, WAFER MAP DISPLAY METHOD, AND COMPUTER PROGRAM

TECHNICAL FIELD

The present invention relates to an inspection system for inspecting a semiconductor wafer, a wafer map display, a wafer map display method, and a computer program.

BACKGROUND

In a process for manufacturing a semiconductor, various electrical inspections are conducted on a plurality of devices (Devices Under Test (DUTs)) formed on a semiconductor wafer (hereinafter, simply referred to as "wafer") after all processes on the wafer are completed. In general, an inspection system for performing the electrical inspection includes a wafer stage, a wafer transfer system, a prober having a probe card with probes to be in contact with the devices formed on the wafer, and a tester for applying electrical signals to the devices and inspecting various electrical characteristics of the devices.

In this inspection system, there is known a technique for conducting inspection for each item and each DUT and displaying inspection results of DUTs, i.e., whether each DUT is PASS or NG, on a wafer map (see, e.g., Patent Document 1).

PRIOR ART

Patent Document 1: Japanese Patent Application Publication No. 2011-210775

Such an inspection system has a self-diagnosis function for acquiring self-diagnosis data, such as contact resistances between the DUTs and probes or leakage currents, and conducting self-diagnosis, as well as a function for inspecting electrical characteristics of devices. When the inspection result or the self-diagnosis result is FAIL due to a failure of a tester, the tester failure can be analyzed based on the result. However, in the case of analyzing the tester failure, there is no device for displaying a defective part of the tester, and the failure analysis requires a long period of time. Further, if the failure can be predicted before the occurrence of the failure, the downtime of an apparatus due to the failure can be reduced. However, there is no technique for predicting the tester failure.

In view of the above, the present invention provides a technique capable of analyzing tester failure within a short period of time and predicting failure.

SUMMARY

In accordance with a first aspect of the present invention, there is provided an inspection system including: a prober including a stage configured to hold a semiconductor wafer having thereon a plurality of DUTs, a transfer unit configured to transfer the semiconductor wafer to the stage, and a probe card configured to bring a plurality of probes into contact with electrodes of the DUTs on the semiconductor wafer; and a tester configured to apply electrical signals to the DUTs on the semiconductor wafer via the probe card to inspect electrical characteristics of the DUTs. The tester includes: a plurality of tester module boards on which multiple LSIs respectively corresponding to the DUTs are mounted; and a control unit having a display unit configured to display a wafer map showing inspection results of the DUTs and/or self-diagnosis results of the tester, and a wafer map drawing application configured to draw the wafer map to be displayed on the display unit. Further, the wafer map drawing application displays the inspection results and/or the self-diagnosis results at display portions for the DUTs on the wafer map in a stepwise manner, and the display portions for the DUTs on the wafer map are respectively linked to correspond to the LSIs mounted on the tester module boards.

In the first aspect, the wafer map drawing application may have a function of filtering DUT display on the wafer map to display only inspection results and/or self-diagnosis results of DUTs corresponding to LSIs of a selected tester module board among the tester module boards, a function of filtering DUT display on the wafer map to display only inspection results and/or self-diagnosis results of DUTs corresponding to LSIs of a selected number on the tester module boards, or a function of filtering the DUT display of the wafer map to display only an inspection result and/or a self-diagnosis result of a DUT corresponding to an LSI of a selected LSI number on a selected tester module board among the tester module boards.

Further, the wafer map drawing application may have a function of detecting a DUT number of a DUT selected on the wafer map and highlighting the selected DUT.

The wafer map drawing application may be configured to include a wafer map drawing control unit configured to control drawing of the wafer map to be displayed on the display unit; and a wafer map drawing information description unit configured to describe information required for drawing the wafer map, the information including display colors of the DUTs, the number of the DUTs, associations between the DUTs and coordinates on the wafer map, and associations between the DUTs and tester module board numbers and LSI numbers. Further, the wafer map drawing control unit may draw the wafer map based on the information of the wafer map drawing information description unit.

In accordance with a second aspect of the present invention, there is provided a wafer map display for displaying a wafer map in an inspection system including a prober including a stage configured to hold a semiconductor wafer having thereon a plurality of DUTs, a transfer unit configured to transfer the semiconductor wafer to the stage, and a probe card configured to bring a plurality of probes into contact with electrodes of the DUTs on the semiconductor wafer; and a tester configured to apply electrical signals to the DUTs on the semiconductor wafer via the probe card to inspect electrical characteristics of the DUTs, the tester having a plurality of tester module boards on which LSIs respectively corresponding to the DUTs are mounted. The wafer map display comprises: a display unit configured to display a wafer map showing inspection results of the DUTs and/or self-diagnosis results of the tester; and a wafer map drawing application configured to draw the wafer map to be displayed on the display unit. Further, the wafer map drawing application displays the inspection results and/or the self-diagnosis results at display portions for the DUTs on the wafer map in a stepwise manner, and the display portions for the DUTs on the wafer map are respectively linked to correspond to the LSIs mounted on the tester module boards.

In accordance with a third aspect of the present invention, there is provided a wafer map display method used in an inspection system including a prober including a stage configured to hold a semiconductor wafer having thereon a plurality of DUTs, a transfer unit configured to transfer the semiconductor wafer to the stage, and a probe card configured to bring a plurality of probes into contact with electrodes of the DUTs on the semiconductor wafer; and a tester configured to apply electrical signals to the DUTs on the semiconductor wafer via the probe card to inspect electrical characteristics of the DUTs, the tester having a plurality of tester module boards on which a plurality of LSIs respectively corresponding to the DUTs is mounted. The wafer map display method for displaying on a display unit a wafer map showing inspection results of the DUTs and/or self-diagnosis results of the tester comprises: dispaying the inspection results and/or the self-diagnosis results at display portions for the DUTs on the wafer map in a stepwise manner in drawing the wafer map to be displayed on the display unit, the display portions for the DUTs being respectively linked to correspond to the LSIs mounted on the tester module boards; and analyzing or predicting failure of the tester based on the inspection results and/or the self-diagnosis results shown on the wafer map.

In accordance with a fourth aspect of the present invention, there is provided a computer program for an inspection system including a prober including a stage configured to hold a semiconductor wafer having thereon a plurality of DUTs, a transfer unit configured to transfer the semiconductor wafer to the stage, and a probe card configured to bring a plurality of probes into contact with electrodes of the DUTs on the semiconductor wafer; and a tester configured to apply electrical signals to the DUTs on the semiconductor wafer via the probe card to inspect electrical characteristics of the DUTs, the tester having a plurality of tester module boards on which a plurality of LSIs respectively corresponding to the DUTs is mounted. The computer program for displaying on a display unit a wafer map showing inspection results of the DUTs and/or self-diagnosis results of the tester comprises a wafer map drawing application configured to draw the wafer map to be displayed on the display unit, and the wafer map drawing application displays the inspection result and/or the self-diagnosis results at display portions for the DUTs on the wafer map in a stepwise manner, and the display portions for the DUTs on the wafer map are respectively linked to correspond to the LSIs mounted on the tester module boards.

According to the aspects of the present invention, the display portions for the DUTs on the wafer map are respectively linked to correspond to the LSIs mounted on the tester module boards. Accordingly, when FAIL is caused by the tester in given inspection or self-diagnosis, it is possible to visually identify the tester failure location and also possible to reduce the time for the failure analysis and the number of processes. Even in the case of PASS in given inspection, since the tester configuration is reflected on the wafer map and the inspection results and/or the self-diagnosis results are displayed at display portions for the DUTs on the wafer map in a stepwise manner, the failure can be predicted by identifying a portion of the tester where the failure is likely to occur from the DUT of which self-diagnosis result is close to FAIL. In addition, since the failure prediction is visually displayed on the wafer map, it is possible to quickly discover and deal with the problem before the occurrence of the tester failure and also possible to reduce the downtime of the apparatus.

DETAILED DESCRIPTION

Hereinafter, embodiments will be described in detail with reference to the accompanying drawings.

(Inspection System)

Figure 1:
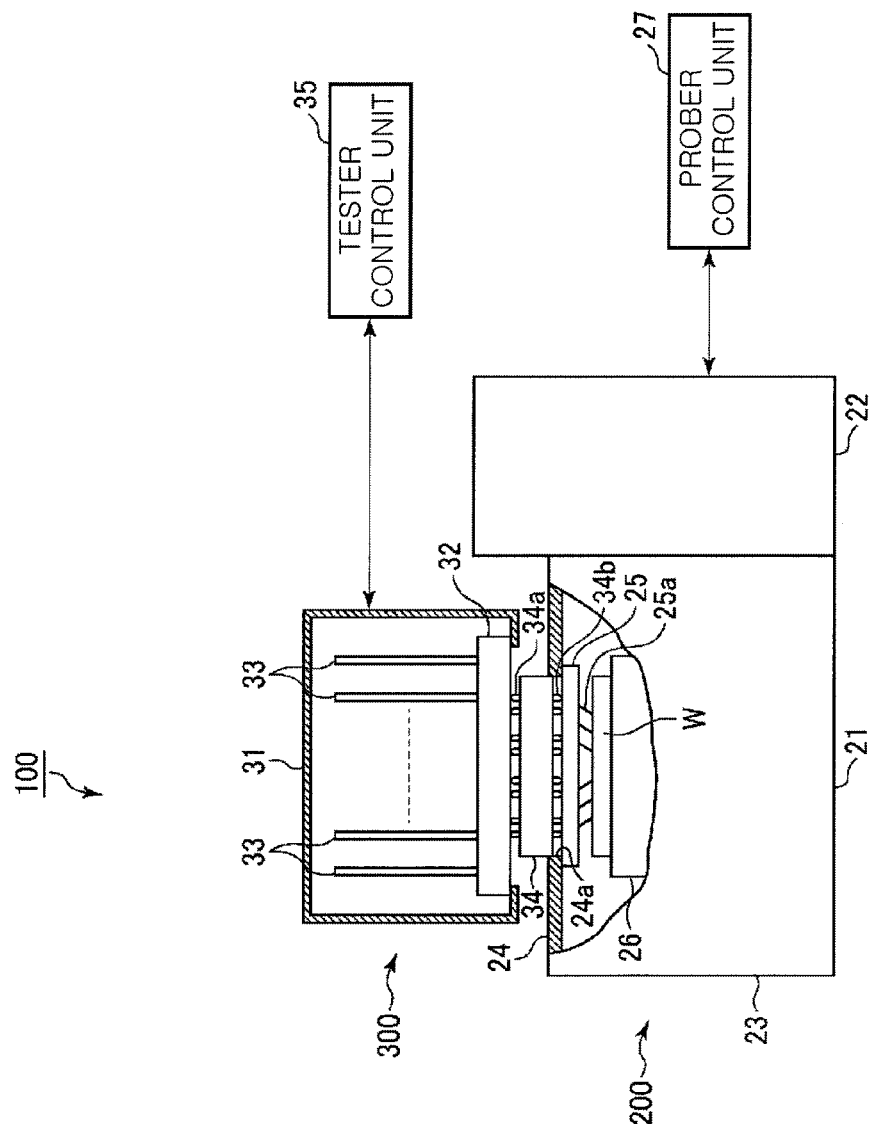
FIG. 1 schematically shows a configuration of an inspection system according to an embodiment of the present invention.

FIG. 1 schematically shows a configuration of an inspection system according to an embodiment of the present invention. The inspection system conducts electrical inspection of a plurality of DUTs formed on a wafer after all processes on the wafer are completed.

As shown in FIG. 1, an inspection system 100 includes a prober 200 for bringing probes of a probe card into contact with devices on the wafer, and a tester 300 for applying electrical signals to the devices to conduct the electrical inspection.

The prober 200 includes a main body 21, a transfer unit 22, and a prober control unit 27.

The main body 21 has a housing 23, a head plate 24 forming an upper surface of the housing 23 and having a circular hole 24a formed at the center thereof, a probe card 25 attached to a position corresponding to the hole 24a of the head plate 24 and having a plurality of probes 25a, and a stage 26 for attracting and holding a wafer W below the probe card 25. The stage 26 is movable in the X, Y, Z, and θ directions by an X-Y table mechanism, a Z-direction moving mechanism, and a θ-direction moving mechanism (all not shown) to position the wafer W at a given inspection position. By raising the wafer W, the probes 25a of the probe card 25 are brought into contact with electrodes of the devices.

The transfer unit 22 has a transfer device (not shown), and is provided with a wafer carrier and a probe card stocker (both not shown). The transfer device transfers the wafer W from the wafer carrier onto the stage 26, and also transfers the probe card 25 from the probe card stocker to a position below the head plate 24.

The prober control unit 27 includes a main controller having a CPU for controlling respective components of the prober 200, an input unit such as a keyboard, a mouse, a remote controller or the like, an output unit such as a printer or the like, a display unit such as a display or the like, and a storage unit storing information required for control. In the case of conducting the inspection, the main controller sets a storage medium storing a processing recipe in the storage unit, thereby causing the prober 200 to execute a given operation based on the processing recipe called from the storage medium.

The tester 300 includes a housing 31, a tester main board 32 disposed horizontally at a bottom portion of the housing 31, and a plurality of tester module boards 33 mounted upright in slots of the tester main board 32, a contact block 34 that connects the tester main board 32 and the probe card 25, and a tester control unit 35.

The tester main board 32 is connected to the probe card 25 via the contact block 34.

The tester module boards 33 apply electrical signals to the DUTs of the wafer W to inspect the DUTs in accordance with various inspection items. A plurality of dedicated LSIs is mounted on the tester module boards. Each tester module board 33 has a number (Slot No.), and each LSI of each tester module board 33 has a number (LSI No.). The LSIs at the same positions on the tester module boards 33 have the same number.

The contact block 34 is connected to the tester main board 32 via a plurality of contact pins 34a, and is also connected to the probe card 25 via a plurality of contact pins 34b. The contact pins 34a and 34b are pogo pins.

Figure 2:
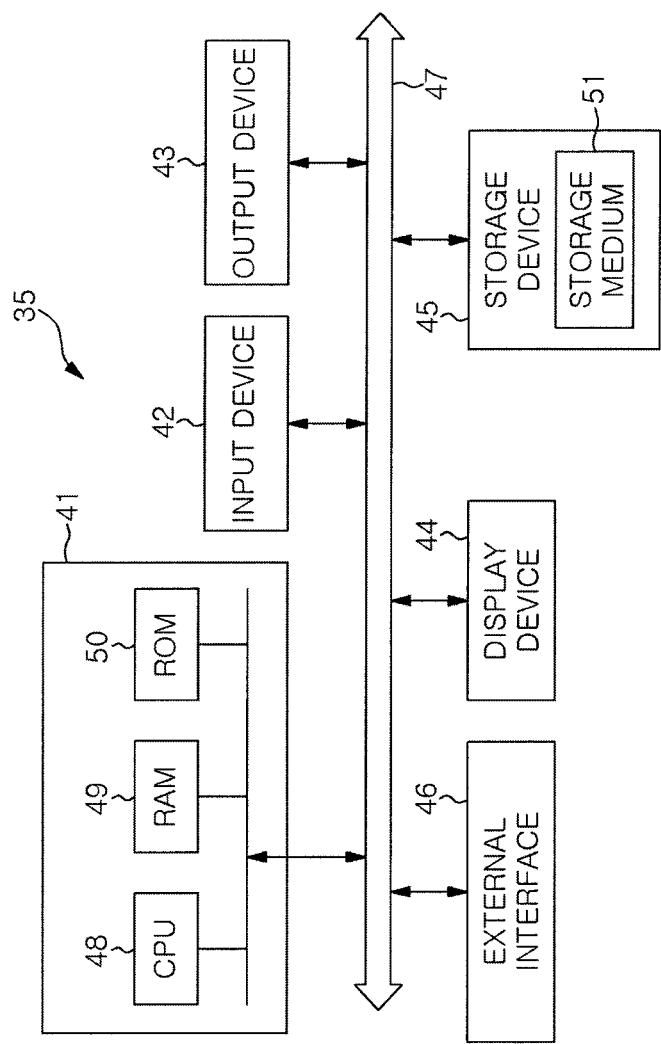
FIG. 2 shows a hardware configuration of a tester control unit.

The tester control unit 35 having main functions of the present embodiment includes a computer for controlling the respective components of the tester 300. FIG. 2 shows a hardware configuration of the tester control unit 35. The tester control unit 35 includes a main controller 41, an input device 42 such as a keyboard or the like, an output device 43 such as a printer or the like, a display device 44, a storage device 45, an external interface 46, and a bus 47 that connects these components. The main controller 41 has a CPU 48, a RAM 49 and a ROM 50. The storage device 45 for storing information is configured to read out information stored in a computer-readable storage medium 51. The storage medium 51 is not particularly limited, and may be, e.g., a hard disk, an optical disk, a flash memory, or the like. In the main controller 41 of the control unit 35, the CPU 48 controls the tester 300 by executing a program stored in the ROM 50 or the storage device 45 using the RAM 49 as a work area. Further, the self-diagnosis result (log data) of the tester 300 and the inspection result information stored in the ROM 50 or the storage device 45 are expanded in the RAM 49, and the wafer map display information to be displayed on the display device 44 is created by a wafer map display function of the CPU 48.

The above-described prober control unit 27 has the same configuration as that of the tester control unit 35. The prober control unit 27 and the tester control unit 35 are connected to a host control unit (not shown).

Figure 3:
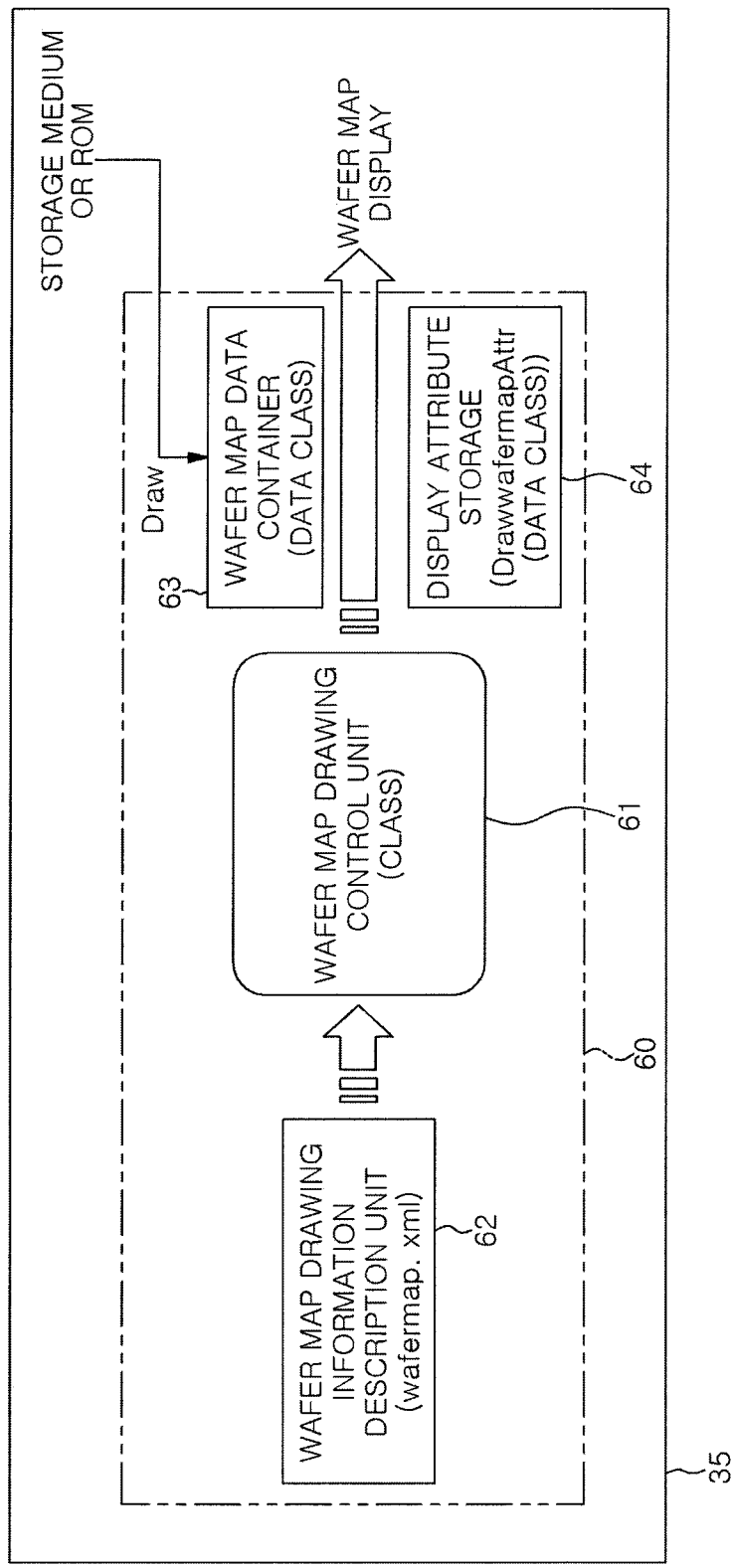
FIG. 3 is a functional block diagram showing a wafer map drawing function in the tester control unit.

FIG. 3 is a functional block diagram showing a wafer map drawing function in the tester control unit 35. The tester control unit 35 includes a wafer map drawing application 60 for executing a wafer map drawing function. The wafer map drawing application 60 has a wafer map drawing control unit (wafer map control class) 61 and a wafer map drawing information description unit (Wafermap.xml) 62, a wafer map data container 63, and a display attribute storage (DrawWaferMapAttr) 64.

The wafer map drawing control unit 61 is a class having a main role in drawing a wafer map related to tester characteristics to be displayed on the display device. The wafer map drawing control unit 61 has the following functions:

(1) a function of drawing data stored in the wafer map data container 63 as a wafer map and displaying the wafer map on the display device 44

(2) a function of detecting a DUT number of a DUT corresponding to a coordinate position clicked on the displayed wafer map and highlighting the DUT of the clicked position (3) a function of filtering the DUT display on the wafer map and displaying only the self-diagnosis results and/or the inspection results of the DUTs corresponding to the tester module board 33 of the selected slot number (Slot No. focus function), and (4) a function of filtering the DUT display on the wafer map and displaying only the self-diagnosis results and/or the inspection results of the DUTs corresponding to the LSIs of the selected LSI number (LSI focus function).

The wafer map drawing information description unit 62 is an xml file (Wafermap.xml) describing information required for drawing the wafer map, such as display colors of the DUTs, the number of the DUTs, associations between the DUTs and coordinates on the wafer map, and associations between the DUTs and slot numbers and LSI numbers of the tester module boards. Such information is loaded in advance when the wafer map drawing control unit (wafer map control class) 61 is created (developed on the memory).

The wafer map data container 63 is a data class for acquiring given information from the inspection data and/or the self-diagnosis data stored in the storage medium 51 or the ROM 50 and using the acquired information as data for drawing a wafer map. The display attribute storage 64 is a data class for storing display attributes (DUT highlight display, Slot focus, LSI focus) of the wafer map. A display method thereof can be changed by a setting method. The wafer map data container 63 and the display attribute storage 64 constitute Draw as a parameter for a drawing method of the wafer map drawing control unit 61. The wafer map drawing control unit 61 draws the wafer map by calling data from the wafer map data container 63 and the display attribute storage 64.

Figure 4:
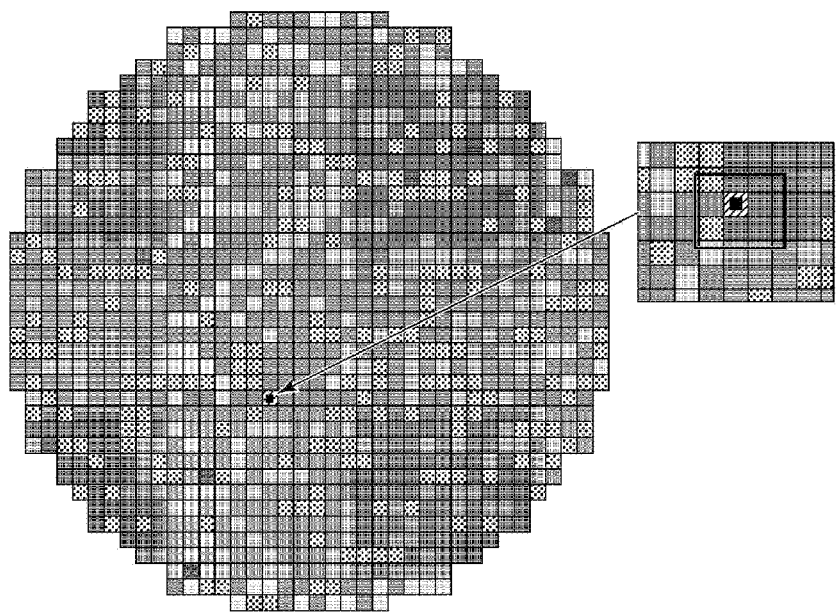
FIG. 4 shows an entire wafer map drawn by a wafer map drawing control unit and shows results of given inspection that has been conducted to analyze tester failure.

FIG. 4 shows the entire wafer map drawn by the wafer map drawing control unit 61, and shows results of given inspection, e.g., voltage measurement, which has been conducted to analyze the tester failure. In FIG. 4, one square represents one DUT, and the display portion for each DUT is linked to correspond to an LSI of the tester module board 33. The data of the test result and/or the self-diagnosis result of the tester 300 is displayed for each DUT, and a degree of deviation from a reference value of the data is displayed in different colors. For example, a PASS state in which there is no tester failure is displayed in four levels. A level 0 in which the degree of deviation from the reference value is small and failure hardly occurs is displayed in green (middle gray in FIG. 4). The degree of deviation from the reference value increases in the order of Level 1, Level 2, and Level 3. Level 1 is displayed in light blue (light gray in FIG. 4). Level 2 is displayed in yellow (dot in FIG. 4). Level 3 is displayed in red (dark gray in FIG. 4). The higher level is close to FAIL and has a high possibility of failure. FAIL indicates that the failure has actually occurred, and is displayed in black. In FIG. 4, the clicked display portion of the DUT corresponding to FAIL is highlighted (frame-displayed).

Figure 5:
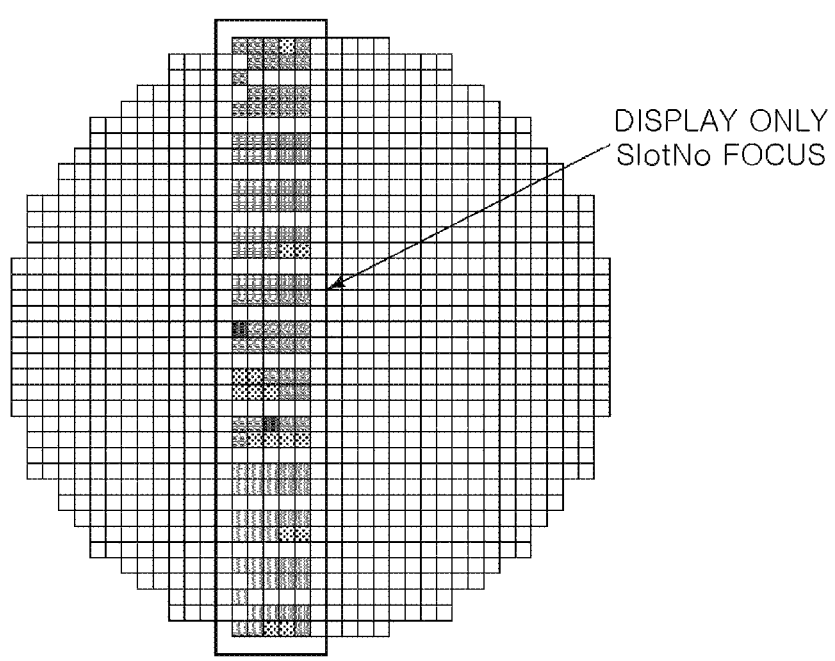
FIG. 5 shows a case of displaying only self-diagnosis results and/or test results of DUTs corresponding to a tester module board 33 having a selected slot number on the wafer map drawn by the wafer map drawing control unit.

FIG. 5 shows the case of displaying (Slot No. Focus) only the self-diagnosis results and/or the inspection results of the DUTs corresponding to the tester module board 33 of a selected slot number on the wafer map drawn by the wafer map drawing control unit 61. Although the inspection results and/or the self-diagnosis results of DUTs corresponding to unselected tester module boards 33 are actually displayed in gray, they are displayed in white in FIG. 5, for convenience.

Figure 6:
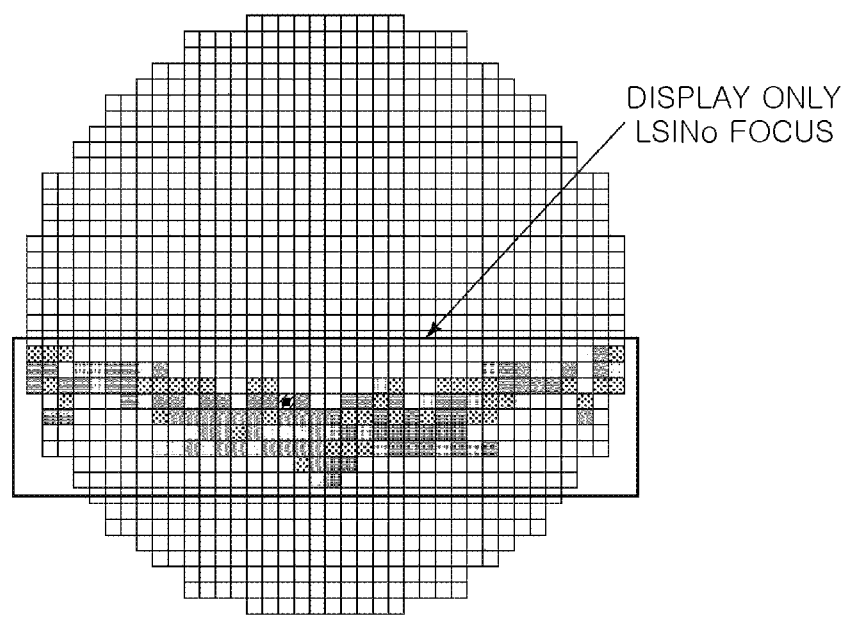
FIG. 6 shows a case of displaying only self-diagnosis results and/or test results of DUTs corresponding to LSIs having a selected LSI number on the wafer map drawn by the wafer map drawing control unit.

FIG. 6 shows the case of only displaying (LSI focus) the self-diagnosis results and/or the inspection results of the DUTs corresponding to the LSIs of a selected LSI number on the wafer map drawn by the wafer map drawing control unit 61. Although the inspection results and/or the self-diagnosis results of DUTs corresponding to LSIs of unselected LSI numbers are actually displayed in gray, they are displayed in white in FIG. 6, for convenience. In the case of the LSI focus, the results of the DUTs corresponding to the LSIs having the same number of the respective tester module boards are displayed.

Figure 7:
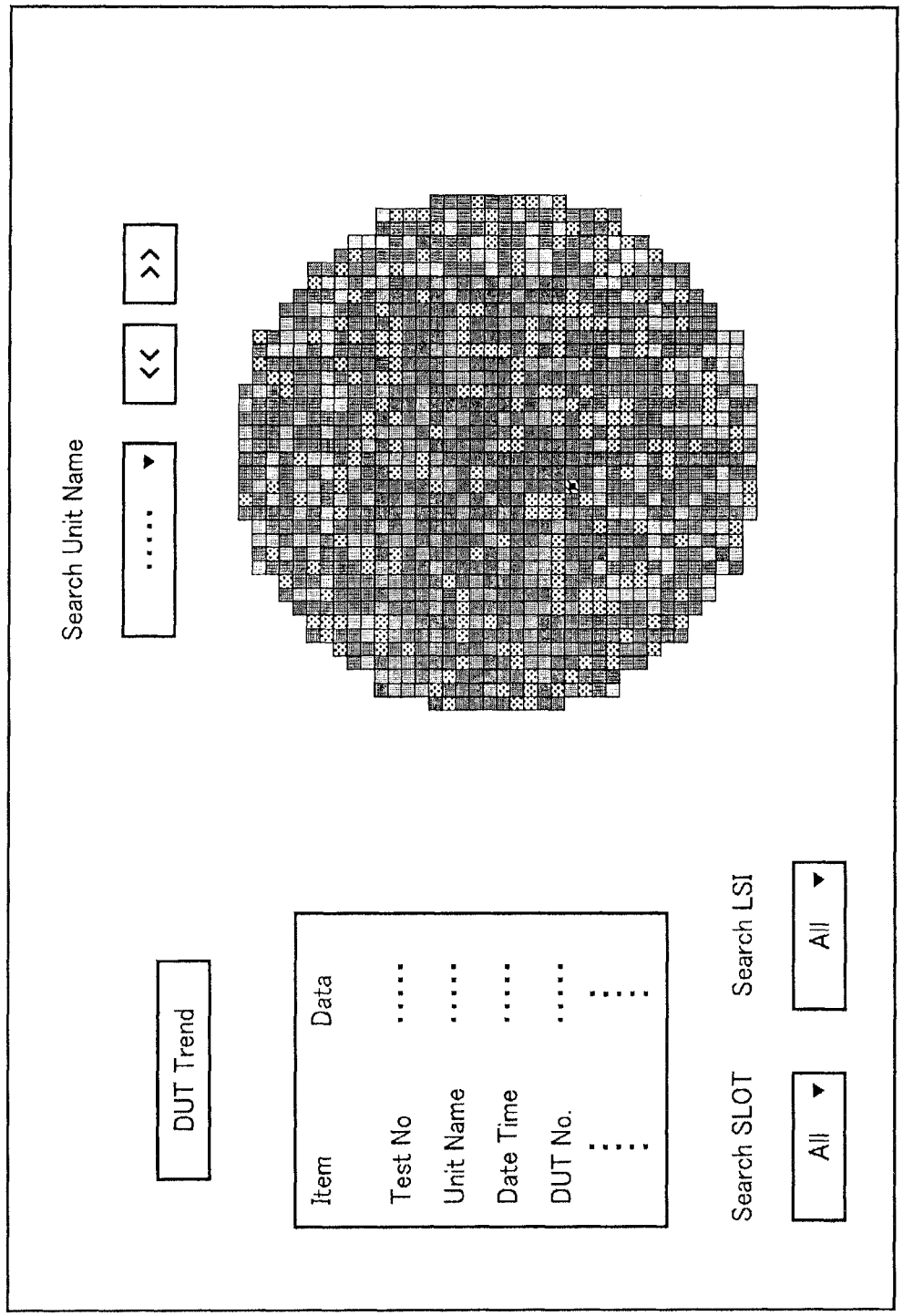
FIG. 7 shows an example of an operation screen displaying the wafer map on a display as a display device.

FIG. 7 shows an example of an operation screen displaying the wafer map on a display as a display device. In the operation screen of FIG. 7, inspection items are displayed below "Search Unit Name". By clicking a side thereof, a specific inspection can be selected among a plurality of, e.g., 20 or more types of inspections. The result of the selected inspection is displayed on the wafer map.

In addition, Slot No. is displayed below "Search SLOT". By clicking a side thereof, a displayed slot number can be selected. As shown in FIG. 5, only the inspection results and/or the self-diagnosis results of the DUTs corresponding to the tester module board of the selected slot number are displayed. In the case of selecting "All", the tester module boards of all slot numbers are selected. LSI No. is displayed below "Search LSI". By clicking a side thereof, a displayed LSI number can be selected. As shown in FIG. 6, only the inspection results and/or the self-diagnosis results of the DUTs corresponding to the LSIs of the selected LSI number are displayed. In the case of selecting "All", the LSIs of all LSI numbers are selected. In FIG. 7, "All" was selected in both of the slot number and the LSI number and, thus, the inspection results and/or the self-diagnosis results of all DUTs are displayed. FIG. 5 shows the case of selecting a given number as the slot number and "All" as the LSI number. FIG. 6 shows the case of selecting "All" as the slot number and a given number as the LSI number. In the case of selecting a given number as each of the slot number and the LSI number, only the result of a DUT corresponding to one LSI is displayed. For example, in the case of selecting "2" as the slot number and "3" as the LSI number, only the result of a DUT corresponding to a third LSI of a second tester module board is displayed.

FIG. 7 shows a state in which the DUT displayed in black indicating FAIL is clicked. By clicking a specific DUT, the clicked DUT is highlighted as described above and, also, the number of clicked DUT and all inspection results and/or self-diagnosis results are displayed.

(Operation of the Inspection System)

In the inspection system 100 configured as described above, the probe card 25 is mounted by the transfer unit 22 of the prober 200 and, then, the wafer W in the carrier is transferred onto the stage 26 by the transfer unit 22. In a state where the wafer W is vacuum-attracted onto the stage 26, the wafer W is electrically inspected by the tester 300. At this time, the probe card 25 is electrically connected to the tester main board 32 via the contact block 34.

In order to conduct the inspection or the self-diagnosis, the stage 26 is raised to bring the probes 25a of the probe card 25 into contact with the DUTs of the wafer W. Next, the electrical signals from the tester module board 33 reach the DUTs of the wafer W via the main board 32, the contact block 34, and the probe card 25, and then return from the DUTs to the tester module board 33 via the probe card 25, the contact block 34, and the tester main board 32. Accordingly, the inspection of the electrical characteristics of each of the DUTs and the self-diagnosis are conducted.

Specifically, voltages, currents, and logic waveforms are outputted from the tester 300 to the DUTs on the wafer. Then, voltages, currents, and logic waveforms from the devices are measured, and PASS and NG of each of the DUTs are determined. In addition, self-diagnosis items such as contact resistances between the probes and the DUTs and leakage currents are measured to determine PASS and NG. The results are displayed on the wafer map.

The failure of the tester 300 can be analyzed based on the inspection result of the electrical characteristics and/or the self-diagnosis result. In the present embodiment, the wafer map reflecting the configuration of the tester 300 is created, and the inspection result and/or the self-diagnosis result of the tester 300 can be displayed at the display portion of each of the DUTs on the wafer map. The failure can be analyzed based on the results.

Specifically, the data of the inspection result and/or the self-diagnosis result of the tester 300 are displayed for each DUT on the wafer map. The display portion of each of the DUTs is linked to correspond to the LSI of the tester module board 33. The data of the inspection result and/or the self-diagnosis result of the tester 300 is displayed for each DUT, and a degree of deviation from the reference value of the data is displayed in different colors. Therefore, when a certain DUT is FAIL, it is possible to quickly analyze failure of an LSI of a test module board which corresponds thereto among the tester module boards 33.

Even if the inspection result and/or the self-diagnosis result of the DUT is PASS, a degree of deviation of the inspection result and/or self-diagnosis result from the reference value can be identified on the wafer map. Therefore, it is possible to identify an LSI of a test module board which is close to FAIL among the tester module boards 33, and also possible to predict the failure. Since the inspection result and/or the self-diagnosis result of the DUT corresponding to the LSI of the tester module board 33 can be visually identified on the wafer map, the failure can be predicted quickly.

The DUT display on the wafer map is filtered to display only the inspection results and/or the self-diagnosis results of the DUTs corresponding to the tester module board 33 of the selected slot number (Slot No. focus) or only the inspection results and/or the self-diagnosis results of the DUTs corresponding to LSIs of a given LSI number on the test module boards 33 (LSI No. focus). Accordingly, it is possible to immediately visually identify a problem, e.g., failure or a state close to the failure due to plug failure of a specific tester module board 33 or wiring failure of an LSI of a specific number of each board. Accordingly, the failure analysis or the failure prediction can be performed quickly.

By clicking the display portion of the specific DUT on the wafer map display screen, the clicked portion can be highlighted and the DUT number can be specified. Therefore, it is possible to specify the LSI of the tester module board 33 corresponding to the DUT, and also possible to identify the defective LSI. Further, since all the information on the clicked DUT can be displayed, other inspection histories of the DUT that was defective in a certain inspection item can be identified, and the failure can be analyzed in detail.

Conventionally, PASS/FAIL of the DUT is displayed on the wafer map. However, there is no technique for analyzing the tester failure by reflecting the tester configuration on the wafer map. In the present embodiment, since the tester configuration is reflected on the wafer map. Therefore, when FAIL is caused by the tester in given inspection or self-diagnosis, it is possible to visually identify the tester failure location and also possible to reduce the time for the failure analysis and the number of processes. Even in the case of PASS in given inspection, since the tester configuration is reflected on the wafer map and the degree of deviation from the reference value in each DUT can be displayed in a stepwise manner on the wafer map, the failure can be predicted by identifying a portion of the tester where the failure is likely to occur from the DUT of which self-diagnosis result is close to FAIL. In addition, since the failure prediction is visually displayed on the wafer map, it is possible to quickly discover and deal with the problem before the occurrence of the tester failure and also possible to reduce the downtime of the apparatus.

In the present embodiment, the wafer map drawing information description unit (Wafermap.xml) 62 describes information on display colors of the DUTs, the number of the DUTs, associations between the DUTs and coordinates on the wafer map, and associations between the DUTs and the slot numbers and the LSI numbers of the test module boards. Therefore, the display color of the wafer map, the number of the DUTs, the corresponding slot (tester main board), the corresponding LSI, and the like are defined. Accordingly, it is possible to flexibly deal with changes in the display color of the wafer map, changes in the number of the DUTs, or the like, and also possible to re-use resources. As a result, the man-hour of software development can be reduced.

(Other Applications)

The present invention is not limited to the above-described embodiment, and various modifications can be made within the scope of the idea of the present invention. For example, in the above-described embodiment, the software is merely an example, and the present invention is not limited thereto as long as a wafer map related to the tester configuration can be displayed. Further, the configuration of the inspection system is not limited to that in the above-described embodiment. For example, in the above-described embodiment, the configuration in which the wafer map is displayed on the display device of the tester control unit has been described. However, only the wafer map display function may be provided by an external PC or the like. In that case, the same wafer map may be displayed on the external PC or the like. In addition, the inspection system may include a plurality of probers and a plurality of testers.

DESCRIPTION OF REFERENCE NUMERALS

21: main body
22: transfer unit
23: housing
24: head plate
25: probe card
25a: probe
26: stage (wafer chuck top)
27: prober control unit
31: housing
32: tester main board
33: tester module board (Slot)
34: contact block
35: tester control unit
41: main controller
42: input device
43: output device
44: display device
45: storage device
48: CPU
49: RAM
50: ROM
51: storage medium
60: wafer map drawing application
61: wafer map drawing control unit (wafer map control class)
62: wafer map drawing information description unit (Wafermap. xml)
63: wafer map data container
64: display attribute storage (DrawWaferMapAttr)
100: inspection system
200: prober
300: tester

The invention claimed is:

1. An inspection system comprising:
a prober including a stage configured to hold a semiconductor wafer having thereon a plurality of DUTs, a transfer unit configured to transfer the semiconductor wafer to the stage, and a probe card configured to bring a plurality of probes into contact with electrodes of the DUTs on the semiconductor wafer; and
a tester configured to apply electrical signals to the DUTs on the semiconductor wafer via the probe card to inspect electrical characteristics of the DUTs,
wherein the tester includes:
a plurality of tester module boards on which multiple LSIs respectively corresponding to the DUTs are mounted; and
a control unit having a display unit configured to display a wafer map showing inspection results of the DUTs and/or self-diagnosis results of the tester, and a wafer map drawing application configured to draw the wafer map to be displayed on the display unit,
wherein the wafer map drawing application displays the inspection results and/or the self-diagnosis results at display portions for the DUTs on the wafer map in a stepwise manner, and the display portions for the DUTs on the wafer map are respectively linked to correspond to the LSIs mounted on the tester module boards.

2. The inspection system of claim 1, wherein the wafer map drawing application has a function of filtering DUT display on the wafer map to display only inspection results and/or self-diagnosis results of DUTs corresponding to LSIs of a selected tester module board among the tester module boards.

3. The inspection system of claim 1, wherein the wafer map drawing application has a function of filtering DUT display on the wafer map to display only inspection results and/or self-diagnosis results of DUTs corresponding to LSIs of a selected number on the tester module boards.

4. The inspection system of claim 1, wherein the wafer map drawing application has a function of filtering the DUT display of the wafer map to display only an inspection result and/or a self-diagnosis result of a DUT corresponding to an LSI of a selected LSI number on a selected tester module board among the tester module boards.

5. The inspection system of claim 1, wherein the wafer map drawing application has a function of detecting a DUT number of a DUT selected on the wafer map and highlighting the selected DUT.

6. The inspection system of claim 1, wherein the wafer map drawing application includes:
a wafer map drawing control unit configured to control drawing of the wafer map to be displayed on the display unit; and
a wafer map drawing information description unit configured to describe information required for drawing the wafer map, the information including display colors of the DUTs, the number of the DUTs, associations between the DUTs and coordinates on the wafer map, and associations between the DUTs and tester module board numbers and LSI numbers,
wherein the wafer map drawing control unit draws the wafer map based on the information of the wafer map drawing information description unit.

7. A wafer map display for displaying a wafer map in an inspection system, wherein the inspection system includes a prober including a stage configured to hold a semiconductor wafer having thereon a plurality of DUTs, a transfer unit configured to transfer the semiconductor wafer to the stage, and a probe card configured to bring a plurality of probes into contact with electrodes of the DUTs on the semiconductor wafer; and a tester configured to apply electrical signals to the DUTs on the semiconductor wafer via the probe card to inspect electrical characteristics of the DUTs, wherein the tester has a plurality of tester module boards on which LSIs respectively corresponding to the DUTs are mounted, the wafer map display comprising:
- a display unit configured to display a wafer map showing inspection results of the DUTs and/or self-diagnosis results of the tester; and
- a wafer map drawing application configured to draw the wafer map to be displayed on the display unit;
- wherein the wafer map drawing application displays the inspection results and/or the self-diagnosis results at display portions for the DUTs on the wafer map in a stepwise manner, and the display portions for the DUTs on the wafer map are respectively linked to correspond to the LSIs mounted on the tester module boards.

8. The wafer map display of claim 7, wherein the wafer map drawing application has a function of filtering DUT display on the wafer map to display only inspection results and/or self-diagnosis results of DUTs corresponding to LSIs of a selected tester module board among the tester module boards.

9. The wafer map display of claim 7, wherein the wafer map drawing application has a function of filtering DUT display on the wafer map to display only inspection results and/or self-diagnosis results of DUTs corresponding to LSIs of a selected number on the tester module boards.

10. The wafer map display of claim 7, wherein the wafer map drawing application has a function of filtering the DUT display of the wafer map to display only an inspection result and/or a self-diagnosis result of a DUT corresponding to an LSI of a selected LSI number on a selected tester module board among the tester module boards.

11. The wafer map display of claim 7, wherein the wafer map drawing application has a function of detecting a DUT number of a DUT selected on the wafer map and highlighting the selected DUT.

12. The wafer map display of claim 7, wherein the wafer map drawing application includes:
- a wafer map drawing control unit configured to control drawing of the wafer map to be displayed on the display unit; and
- a wafer map drawing information description unit configured to describe information required for drawing the wafer map, the information including display colors of the DUTs, the number of the DUTs, associations between the DUTs and coordinates on the wafer map, and associations between the DUTS and tester module board numbers and LSI numbers,
- wherein the wafer map drawing control unit draws the wafer map based on the information of the wafer map drawing information description unit.

13. A wafer map display method used in an inspection system, wherein the inspection system includes a prober including a stage configured to hold a semiconductor wafer having thereon a plurality of DUTs, a transfer unit configured to transfer the semiconductor wafer to the stage, and a probe card configured to bring a plurality of probes into contact with electrodes of the DUTs on the semiconductor wafer; and a tester configured to apply electrical signals to the DUTs on the semiconductor wafer via the probe card to inspect electrical characteristics of the DUTs, the tester having a plurality of tester module boards on which a plurality of LSIs respectively corresponding to the DUTs is mounted, the wafer map display method for displaying on a display unit a wafer map showing inspection results of the DUTs and/or self-diagnosis results of the tester, comprising:
- displaying the inspection results and/or the self-diagnosis results at display portions for the DUTs on the wafer map in a stepwise manner in drawing the wafer map to be displayed on the display unit, wherein the display portions for the DUTs are respectively linked to correspond to the LSIs mounted on the tester module boards; and
- analyzing or predicting failure of the tester based on the inspection results and/or the self-diagnosis results shown on the wafer map.

14. The wafer map display method of claim 13, wherein the DUT display on the wafer map is filtered to display only inspection results and/or self-diagnosis results of DUTs corresponding to LSIs of a selected tester module board among the tester module boards.

15. The wafer map display method of claim 13, wherein the DUT display of the wafer map is filtered to display only inspection results and/or self-diagnosis results of DUTs corresponding to LSIs of a selected number on the tester module boards.

16. The wafer map display method of claim 13, wherein the DUT display of the wafer map is filtered to display only an inspection result and/or a self-diagnosis result of a DUT corresponding to an LSI of a selected LSI number on a selected tester module board among the tester module board.

17. The wafer map display method of claim 13, wherein a DUT is selected on the wafer map, a DUT number of the selected DUT is detected, and the selected DUT is highlighted.

\* \* \* \* \*